United States Patent [19]

Hwang

[11] Patent Number: 4,493,142
[45] Date of Patent: Jan. 15, 1985

[54] III-V BASED SEMICONDUCTOR DEVICES AND A PROCESS FOR FABRICATION

[75] Inventor: James C. Hwang, Berkeley Heights, N.J.

[73] Assignee: AT&T Bell Laboratories, Murray Hill, N.J.

[21] Appl. No.: 376,178

[22] Filed: May 7, 1982

[51] Int. Cl.³ ............... H01L 21/203; H01L 21/477
[52] U.S. Cl. .................................. 29/575; 29/580; 29/576 T; 148/1.5; 148/175; 148/176
[58] Field of Search ............... 148/1.5, 175, 176; 29/576 T, 580, 576 E, 575

[56] References Cited

U.S. PATENT DOCUMENTS 3,493,811  2/1970  Ewing .................................. 148/175
3,752,713  8/1973  Sakuta et al. .................. 148/173 X
3,969,164  7/1976  Cho et al. ............................ 148/175

OTHER PUBLICATIONS

Cho, "Morphology of Epitaxial Growth of GaAs by a Molecular Beam Method:" Jour. Appl. Phys., vol. 41, No. 7, pp. 2780–2786, Jun. 1970.

Cho, "GaAs Epitaxy by a Molecular Beam Method:" Jour. Appl. Phys., vol. 42, No. 5, pp. 2074–2081, Apr. 1971.

Blakeslee, "Effects of Substrate Misorientation in Epitaxial GaAs," Transactions of Metallurgical Society of AIME, vol. 245, pp. 577–581, Mar. 1969.

*Primary Examiner*—Brian E. Hearn
*Assistant Examiner*—David A. Hey
*Attorney, Agent, or Firm*—Bruce S. Schneider

[57] ABSTRACT

Extremely high-purity and defect-free layers of III-V semiconductor materials are produced by a specific MBE process. This process as applied to GaAs includes protecting the deposition substrate with a passivating surface, removing this surface in situ, treating the bared substrate heated to a temperature below its incongruent melting point with an arsenic-containing gas, and initiating the MBE growth in an environment containing an excess of arsenic over gallium.

10 Claims, 7 Drawing Figures

III-V BASED SEMICONDUCTOR DEVICES AND A PROCESS FOR FABRICATION

BACKGROUND OF THE INVENTION

1. Field of the Invention

This invention relates to semiconductor processing and, in particular, to processing of III-V based semiconductor materials.

2. Art Background

A variety of devices based on III-V semiconductor materials, i.e., III-V binaries, ternaries, pseudoternaries, and pseudoquaternaries containing at least one group III and at least one group V entity, has been produced. For example, both discrete components such as gallium arsenide field effect transistors (FETs) and also gallium arsenide integrated circuits have been made. These devices exhibit desirable properties such as relatively high-speed operation due to the advantageous properties of III-V based semiconductor materials, e.g., the high resistivity or high-carrier mobility of suitably doped III-V based semiconductor materials.

Despite the advantages offered by devices based on III-V semiconductor materials, certain aspects of these devices, although acceptable, could still advantageously be improved. For example, the active region of GaAs FETs is generally built upon a semi-insulating buffer layer. This buffer layer interposed between the device active region and the substrate is used to avoid the undesirable effects such as degraded mobility of carriers in proximity to an active layer/substrate interface. (See, for example, T. Nozaki et al, Institute of Physics Conference Series, 24, 46 (1975).) This buffer layer is usually formed by epitaxially depositing a chrome-doped GaAs material onto the GaAs substrate. By employing chrome compensation for the background impurity-induced carrier concentration, the resulting doped GaAs has a suitably high resistivity, e.g., above approximately $10^6$ ohm-cm as compared to about 1 ohm-cm for nominally undoped GaAs material grown by conventional chemical vapor deposition (CVD) and molecular beam epitaxy (MBE) deposition techniques.

Although chrome-doped, semi-insulating layers are presently being employed with great success in device structures, the concentration of the chrome dopant is not precisely controllable. Thus, from one deposition run to another, the background carrier concentration will vary in an unpredictable manner. Compensation for this background is done for an average background level. The variation between the average background level and the actual level, together with the variation between desired compensation level and the level actually produced, leads to under or overcompensation. In addition, the chrome dopant has a tendency, especially in the case of overcompensation, to diffuse into the device active region. This diffusion, although in no way catastrophic, introduces difficulties in maintaining the discrete active layer/buffer layer interface which is required for producing the most efficient device operation. Nevertheless, an acceptable alternative to chrome doping which produces an appropriate semi-insulating region with appropriate resistivity has not been developed.

Dopants other than chrome are also introduced into III-V based semiconductor material to provide a relatively high majority carrier concentration. Such III-V based semiconductor materials made by presently employed techniques involving CVD are quite acceptable. (Mobilities on the order of $10^5$ cm$^2$/Vs and higher are achieved.) These conductive materials are used, for example, to form the active region of various devices. When used in these applications, limitations on thickness as well as dopant control present in CVD methods become significant. It is typically difficult to control CVD layers to better than $\pm 0.1$ $\mu$m from one deposition run to another. Additionally, the thickness across a deposited layer is somewhat nonuniform, e.g., thickness variations greater than $\pm 10$ percent. These variations, across a layer and from one layer to another, prevent the deposition of thin layers, i.e., layers less than about 0.1 $\mu$m thick. Since thin layers are not available, devices such as selectively doped heterostructure transistors (SDHT) and normally off III-V based FETs that involve thin layers of precisely controlled thicknesses are not producible by CVD. (See T. Mimura, S. Hiyamizu, T. Fujii and K. Nanbu, Japanese Journal of Applied Physics, 19, L225 (1980).) The inability to produce normally off III-V FETs, in turn, severely limits the usefulness of III-V integrated devices.

In contrast, MBE has been used to produce relatively uniform layers of III-V based semiconductor material as thin as 100 Å. However, as previously discussed, III-V based semiconductor devices rely on the relatively high-carrier mobilities of III-V based semiconductor material to offer the possibility of enhanced properties such as low field device operation and relatively high-speed operation. (Parasitic capacitance is inevitably present in a device. Typical operating fields in conjunction with this capacitance introduce significant time delays, while relatively low fields do not.) Despite its advantageous characteristics relating to thickness control, MBE procedures have produced mobilities in doped layers that are somewhat worse than those obtained in doped layers produced by CVD. Thus, presently available techniques, although quite acceptable, do limit the properties of III-V based devices.

SUMMARY OF THE INVENTION

Excellent quality III-V based semiconductor materials having compositional uniformity with a controlled uniform thickness are produced through a specific procedure involving MBE. For example, GaAs produced by this technique, when doped with Si to a level of $1 \times 10^{14}$ cm$^{-3}$, has a peak mobility of approximately 140,000 cm$^2$/Vs. These materials, e.g., GaAs, when appropriately doped and used in the active region of devices such as GaAs FETs, yield excellent results. If such semiconductor materials are produced without doping, the resistivity of the resulting undoped materials is quite high, e.g., higher than $10^7$ ohm-cm. This undoped material exhibits excellent characteristics making it quite advantageous for use in the buffer layers of devices such as GaAs FETs and the junction layers of devices such as SDHTs. Thus, through the use of the inventive method, devices having enhanced properties such as enhanced gain and efficiency are producible, devices employing an undoped, semi-insulating layer are made feasible, and the limitations associated with chrome doping are avoided.

The inventive process involves the MBE deposition of a III-V based semiconductor material on a deposition substrate, i.e., a body being processed or to be processed into a device which includes regions of semiconductor material, metal, and/or insulating material. The surface of the substrate upon which deposition is to occur is cleaned, and a continuous passivating layer, e.g., a thin oxide layer, is produced on this surface. In the protected environment of an MBE apparatus, the passivating layer is removed and the exposed surface of the substrate, which is held at a temperature above the passivating layer removal temperature, e.g., the oxide desorption temperature, but below the incongruent melting temperature is subjected to a flux of volatile entities, e.g., those corresponding to the volatile species of the substrate (arsenic in the case of a GaAs substrate) or another volatile group V entity. A flux of the species corresponding to the entities of the material to be deposited, e.g., gallium species and arsenic species in the case of a GaAs deposited material, is then introduced to induce deposition of the desired material. During this deposition, the flux of volatiles is maintained at an excess over the flux of the nonvolatiles. Through the use of these expedients employed in a carefully degassed environment of a high-vacuum MBE apparatus, III-V based semiconductor materials having the previously described desirable properties are formed.

DETAILED DESCRIPTION

Figure 1:
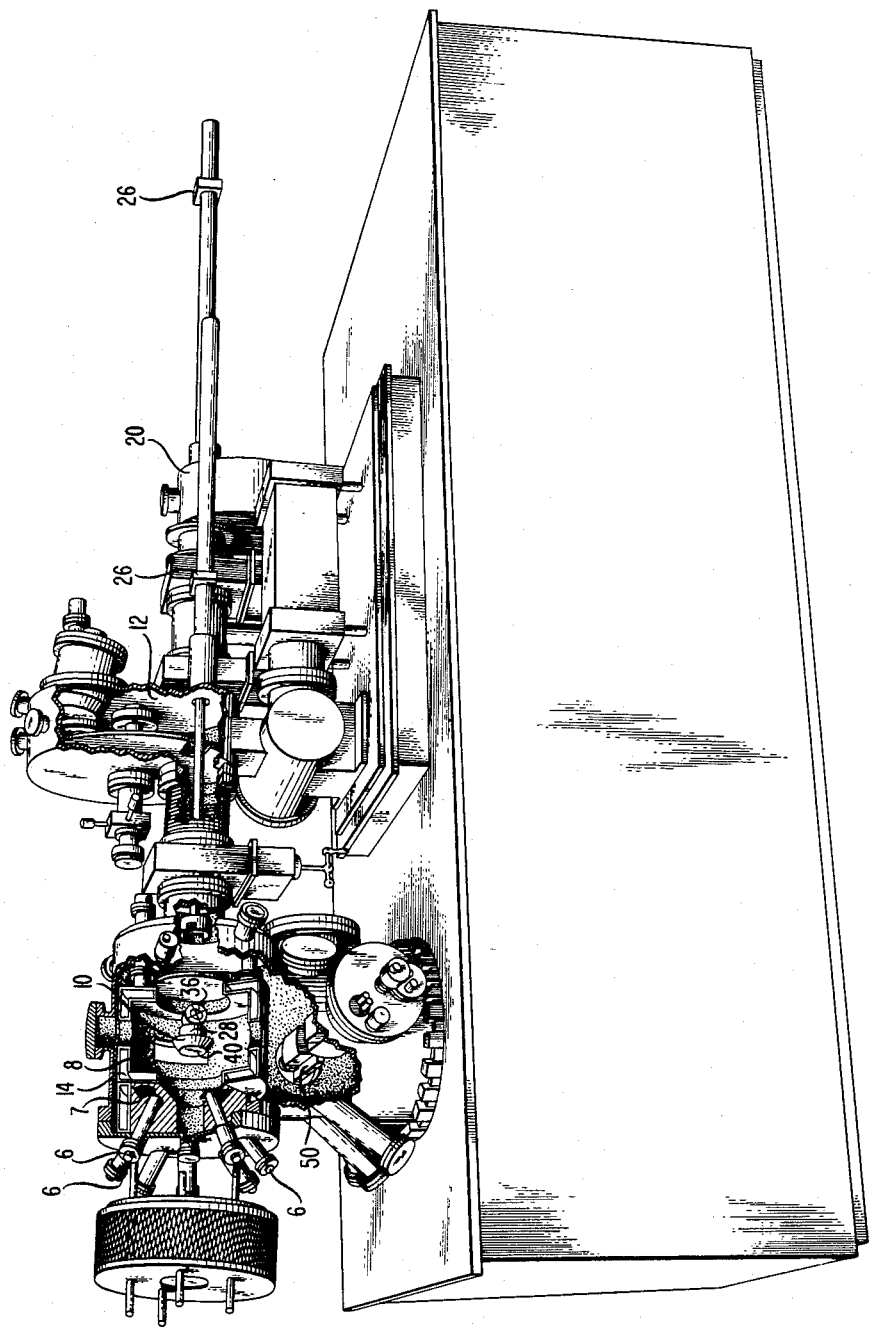
FIGS. 1-7 are illustrative of the inventive process and devices.
Figure 2:
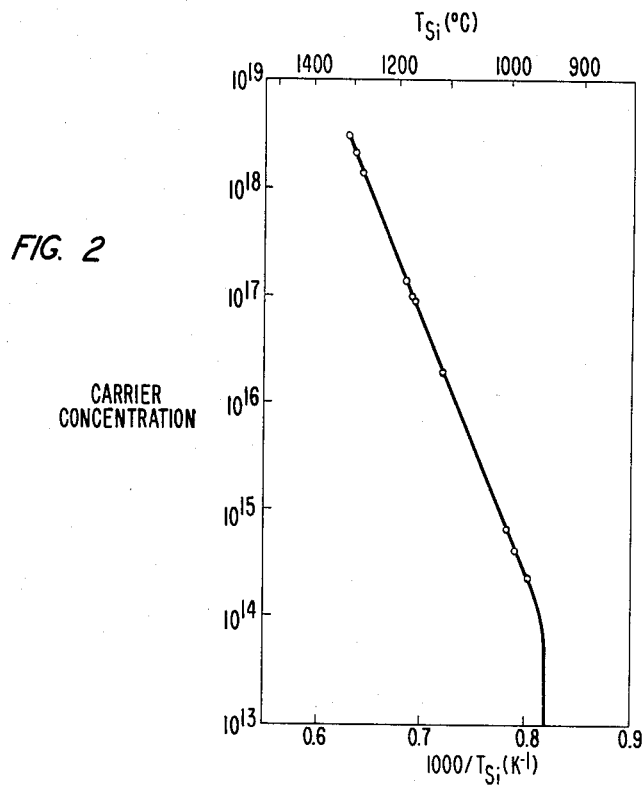

Before insertion into the MBE apparatus, the surface of the deposition substrate, i.e., the body upon which deposition is to be performed, should be thoroughly cleaned and passivated with a continuous, compositionally uniform oxide film. The surface of the substrate is cleaned and if necessary, polished by conventional techniques such as an etch to remove saw marks, a treatment in suitable solvents to remove organic residues, and an etch to remove polishing damage. In one embodiment a passivating layer is made by producing an oxide on the cleaned surface. This oxide layer is formed by subjecting the surface to an extremely pure oxidizing agent to produce a correspondingly pure oxide layer. In particular, it is convenient to use deionized water as the oxidation agent. Resistivity is a good measure of water purity. Generally, the water used as an oxidizing agent should be sufficiently pure so that its resistivity is greater than $1.8 \times 10^7$ ohm/cm$^2$. Further, the water should be filtered to remove electrically neutral impurities such as bacteria. In this manner, after the substrate is cleaned in, for example, an etching solution, its surface while still wet is subjected to high-purity water. A passivating oxide thus forms upon treatment with the water before there is any substantial contamination of the surface.

It is desirable that the oxide layer be relatively thin but continuous in the area overlying the surface of the substrate upon which the III-V based semiconductor material is to be deposited. Generally, oxide layers having thicknesses in the range 25 to 250 Å are desirable. Thinner layers tend to be discontinuous. Thicker layers generally require excessive treatment times to remove the oxide during subsequent processing and increase the possibility of residual impurities being left on the substrate. It is also desirable to consistently obtain substantially the same oxidized layer thickness from one deposition substrate to another. (The production of oxide layers that vary in thickness from one deposition substrate to another is not precluded. However, such variation results in the inconvenience of adjusting the parameters of subsequent processing steps for the particular thickness being employed and, therefore, is usually not desirable.)

The necessary treatment times for producing the desired thickness with a given oxidizing agent are easily determined using a control sample. Exemplary of suitable times is a time period generally in the range 15 seconds to 5 minutes that is utilized when water is the oxidizing agent. Advantageous thickness consistency from one deposition substrate to another is achieved by maintaining, to within ±5 percent, a consistent substrate treatment time from one deposition substrate to another.

An MBE apparatus (FIG. 1) having an ultra-high vacuum system, together with a means for loading the sample without increasing the pressure in the deposition chamber, is employed. The passivated substrate is mounted on a sample holder, 10, is introduced into the MBE apparatus, and by conventional techniques is brought into a preparation chamber, 12. This chamber has a base pressure below $1 \times 10^{-8}$ Torr and adjoins the deposition chamber. The substrate is mounted by conventional techniques such as the use of an intermediate indium layer between the sample holder, e.g., a molybdenum block, and the substrate. Any adsorbed or occluded gas on the sample holder, substrate, or on any intermediate layer is removed in the preparation chamber by subjecting the unified body, i.e., the sample holder with its attached substrate, to an elevated temperature. Typically, temperatures in the range 160 to 200 degrees C. are sufficient to produce the desired degassing, e.g., water vapor and air degassing. Higher temperatures are generally not desirable since they tend to induce surface reactions while lower temperatures are typically not adequate to remove the undesirable gases. Specifically, if indium is used to join the substrate and the sample holder, a temperature above its melting point, i.e., 157 degrees C., is used to ensure (1) melting of the indium, (2) removal of occluded gases, and (3) the formation of a strong liquid seal between the sample and its holder.

The sample is then transferred to the deposition chamber, 8, which should have a base pressure below $1 \times 10^{-10}$ Torr. Before growth of the III-V based semiconductor material is initiated, the passivation layer, e.g., the oxide layer is removed, for example, by thermal desorption, and the uncovered surface of the deposition substrate is treated with a beam flux containing the species (atoms or groups of atoms in a charged or neutral state) of the substrate that are volatile, i.e., the species of the substrate which have a vapor pressure above $10^{-10}$ Torr as measured when the substrate is heated to the temperature to be used for deposition. It is possible in the flux to use another volatile species which will occupy the crystal cite of the volatile species in the substrate, either in place of or in combination with volatile substrate species. It is generally desirable that the treatment with a suitable beam flux occurs immediately after the removal of the surface oxide so that a substantial quantity of impurities from the environment does not have an opportunity to react with the deposition surface. This goal is conveniently achieved by initially introducing a beam flux containing the volatiles into the deposition chamber. This introduction is, in turn, conveniently accomplished by employing an effusion source, 6, or sources that are typically utilized in MBE equipment. Such sources are charged with a high-purity material such as elemental arsenic that upon heating yields the desired gaseous flux. (A source material purity greater than 99.9999 percent is typically desirable.)

Initially the effusion sources are heated with their shutters, 7, closed. This heating prepares the source for providing the desired flux. However, the closed shutter only allows a relatively small flux of volatiles into the deposition chamber. The substrate is heated to a temperature sufficient to prevent condensation upon the substrate surface of the volatile species but not sufficient to induce removal of the oxide layer from the deposition substrate. For example, a temperature in the range 475 to 525 degrees C. is used for a GaAs substrate. Thus, an appropriate flux of volatiles is producible before the oxide removal is initiated, but such initiation is rapidly achievable after flux production by a relatively small temperature increase.

The desired flux of volatiles at the substrate is then established by opening the individual shutter for each source of these volatiles. Fluxes of each volatile species at the substrate in the range $5 \times 10^{14}$ to $1.5 \times 10^{15}$ cm$^{-2}$ s$^{-1}$, preferably $9 \times 10^{14}$ to $1.1 \times 10^{15}$ cm$^{-2}$ s$^{-1}$, are employed. (The presence of a gas that does not adversely affect the deposition substrate or the volatile species being transported is not precluded, and flux rates given refer only to the flux rate of each volatile entity irrespective of any other gas. For example, it is possible to produce a source of arsenic by heating in the source arsine. This produces arsenic entities and hydrogen. Although the hydrogen enters the chamber, it does not adversely affect the MBE process.) Generally, if higher flux rates are employed, then excess vacancies in the substrate of nonvolatile species such as Ga are produced, while if lower flux rates are employed, vacancies in the substrate of the volatile species are formed.

Figure 7:

Once a suitable gas flow is established, the passivating layer, e.g., the oxide layer, on the substrate is removed to allow the desired defect treatment. This removal in the case of an oxide layer is conveniently achieved by heating the substrate. For example, a temperature in the range 530 to 560 degrees C. in the case of a GaAs substrate. The substrate is then maintained at an elevated temperature, i.e., above the passivating layer removal temperature but below the incongruent melting temperature of the substrate. (See. F. N. Rhines, Phase Diagrams in Metallurgy Their Development and Application, McGraw-Hill, New York, page 78, 1956 for the definition of incongruent melting temperature.) Generally, in the case of GaAs substrate temperatures below 530 degrees C. do not induce the removal of the oxide layer and are insufficient for treating the subsequently exposed substrate. At temperatures above the incongruent melting temperature, e.g., 630 degrees C. for GaAs, volatile species are driven from the substrate at a rate that prevents adequate repair of the resulting defects by the presence of the volatile-containing gas flow. (It should be noted that a passivation layer should be chosen which is removable at a temperature below the substrate incongruent melting temperature.) The gas flow containing the volatile species is continued for a sufficient time to allow defect repair to occur. Typically, such repair is observed by a reflection electron diffractometer. For sufficient repair, the observed pattern should have essentially continuous streaks, such as shown in FIG. 7, with the partial orders characteristic of a reconstructed surface. (See. A. Y. Cho, Journal of Applied Physics, 42, page 2074 (1971). Generally, to attain such a level of repair, treatment times in the range 1 to 10 minutes are employed. Shorter treatment times lead to incomplete repair while longer treatment times lead to surface roughing. (Thus it is desirable that the temperature employed during substrate repair, irrespective of the passivation layer removal technique that is utilized also be sufficient to reduce impurity absorption. It should additionally be noted that although the substrate is generally repaired with the same volatile group V entity that the substrate contains, it is also possible to cure defects with another volatile group V entity.)

After the passivation layer, e.g., the oxide layer, is removed and repair is accomplished, growth of the desired III-V based semiconductor material is initiated. This growth is begun by introducing a flux from individual sources, e.g., effusion sources, 6. The sources employed provided a species corresponding to each element that composes the material that is to be deposited. For example, if GaAs is to be deposited, a flux of gallium entities and a flux of arsenic entities are utilized. If doped GaAs is to be deposited, then a flux of gallium, a flux of arsenic, and a flux of a dopant such as silicon are utilized. Similarly, if gallium aluminum arsenide is to be deposited, then a flux of gallium, aluminum, and arsenic is employed. The combined flux of the volatile species resident on the substrate such as arsenic, i.e., those species that at the deposition temperature have a vapor pressure from the material to be deposited of greater than $10^{-10}$ Torr, should be in mole excess to the combined flux of relatively nonvolatile species such as gallium. The amount of a particular entity resident on a substrate depends on the relative sticking efficiencies of the volatile and nonvolatile species on the substrate at the deposition temperature. To achieve this result, typically flux ratios from the sources of volatile to nonvolatile species should be in the range 1.5 to 3. Generally, if mole flux excesses higher than 200 percent are employed, typically, defects are produced which act as doping centers. A measure of the flux rate for a nonvolatile species is obtained by measuring with an ionization gauge the pressure produced by the particular nonvolatile species flux. This pressure measurement is correlated to flux by monitoring the deposition rate of controlled samples. Similarly, the pressure from the flux of a volatile species is measured with an ionization gauge, and this pressure is correlated to flux using the ionization yield of the species. (Such correlations are approximations but are sufficiently accurate to allow reproducible establishment of suitable relative fluxes.) The mole ratios of the nonvolatile species that are utilized depend on the particular composition that is to be deposited. A suitable gas flux of each nonvolatile species for a desired deposited semiconductor composition is easily determined through the use of a controlled sample.

The absolute flux rate of the various constituents should also be controlled to yield a desirable growth rate. Growth rates in the range 0.1 to 10 μm/h should be employed. If the growth rate is less than 0.1 μm/h, there is an unacceptably high chance that impurities will adsorb on the growth surface. If the growth rate is greater than 10 μm/h, typically an excessively high defect density in the deposited material is produced. The growth rate is determined by conventional techniques such as growing a layer on a control sample and measuring with a scanning electron microscope the thickness of the layer formed during the period of growth.

To induce growth on the deposition substrate, the substrate temperature should be maintained in a suitable range such as 530 to 630 degrees C. for GaAs. If excessively high temperatures are employed, the surface morphology of the deposited semiconductor material is degraded. This degradation occurs since, at excessive temperatures, it is difficult to avoid the production of defects resulting from the heat-induced loss of the relatively volatile species, e.g., arsenic, from the deposited material. However, insufficiently high temperatures generally allow background impurities to adsorb on the substrate and thus result in degraded semiconductor material properties. (It should be noted that it is desirable during growth that the substrate be rotated. This rotation helps produce a more uniform layer. Typically, rotation speeds in the range 1 to 25 rpm are desirable.)

Additionally, fluctuations in the substrate temperature should be avoided since they affect the sticking efficiency of the volatile species, affect the incorporation of dopants, and induce strain in the deposited material. Generally, it is desirable to maintain the substrate temperature during the growth procedure to within ±10 degrees C. (It is also desirable, but not essential, that the final repair temperature be within this ±10 degrees of the growth temperature.) The growth temperature is typically controlled to this degree by passing a constant current through a resistance heater positioned behind the substrate holder. Maintaining the current within ±1 percent typically allows the maintenance of the temperature within the desired fluctuation limits. The temperature is monitored by conventional techniques such as the use of a thermocouple or a pyrometer. (The measurement by such techniques is advantageously calibrated by employing a calibration sample having materials that form a eutectic, e.g., Al on an Si substrate. The substrate employed is the same size as the substrate ultimately to be used in depositions. The temperature is raised until a phase transition is observed. Since the phase transition temperature is well known, the current used in the heater at the time of phase change is precisely correlated with this temperature. Use of a variety of eutectic mixtures yields a suitable calibration curve.) It should be noted that a change in the substrate, shape, or size will produce a different temperature for a given amount of heater current. It is convenient, although not essential, that the sample size from deposition run to deposition run be maintained at a relatively constant size so that adjustment of the calibration curve is unnecessary.

During the growth procedure, the flux rate of the volatile species such as arsenic tends to fluctuate since the volatile source material depletes more rapidly than nonvolatile source materials. As previously discussed, it is desirable that the flux of the volatile species be in excess of the nonvolatiles flux but below a 200 percent excess. Thus, the flux rates of the volatile species should be periodically adjusted during growth to maintain this level. This adjustment is conveniently made by monitoring the background pressure (which consists of mostly volatile species) throughout the growth run and adjusting the source temperature of the volatile species accordingly. The growth is continued until the desired thickness of III-V based semiconductor material is deposited. The growth is then terminated by conventional techniques. For example, the source shutters are closed concurrently with the termination of the heating of the substrate. The concurrent termination of the substrate heating with the termination of the gas flows is desirable. If the temperature of the substrate is maintained at a high level in the absence of the volatile species gas flow, defects are induced at the surface of the heated substrate. Although the arsenic shutter is closed at approximately the same time that the heating is terminated, generally there are sufficient residual volatile species in the equipment to avoid defect production while the substrate is cooling.

After deposition the device is completed by conventional techniques. The following examples are illustrative of the subject invention.

EXAMPLE 1

A chrome-doped ($10^{16}$ cm$^{-3}$) semi-insulating gallium arsenide single crystal boule fabricated by the horizontal Bridgman procedure was sliced using a diamond disk along the (001) crystal plane. The wafer thus produced was ground to a round shape with a two-inch diameter, and both its sides were polished to an optical finish utilizing a bromine methanol solution. (During this polishing, the substrate was constantly traversed on a rotating holder across a soft cloth pad.) The major portion of any residual hydrocarbon material utilized to mount the wafer during the polishing procedure was removed by sequentially scrubbing the wafer with a cotton swab in trichloroethylene and acetone. The wafer was then further cleaned by sequentially immersing the wafer in boiling trichloroethylene, boiling acetone, and boiling methanol. During each solvent cleaning step, three treatments of 3 minutes each in a fresh solvent bath were used. The wafer was then rinsed in deionized bacteria-free water that had a resistivity greater than 18 megaohms. (Water of this purity was produced by recirculating the water through a series of deionization resins and filters.) This rinsing was accomplished by immersing the wafer in a series of baths containing only the high-purity water utilizing fixtures made of high-purity quartz. To remove any oxide coating without substantially effecting the gallium arsenide material itself, the wafers were then immersed for at least 2 minutes in concentrated hydrochloric acid. The wafers were again rinsed in high-purity water by the previously described procedure. (The wafer upon transference from the HCl to the water rinse and subsequent pregrowth treatment steps was kept in a horizontal position to ensure that the surface remained covered with an aqueous medium.) The wafers were then immersed in a freshly prepared room temperature 5:1:1 solution of concentrated sulfuric acid, 30 percent hydrogen peroxide, and water. (The water was high-purity water, and the other reagents were semiconductor grade reagents.) The substrates were agitated for approximately 2 minutes in the solution to ensure uniformed etching. This etching was followed by the previously described water-rinse procedure.

The wafer was then again treated for 2 minutes in a concentrated HCl bath. The water-rinse was repeated in a series of fresh deionized water baths by the previously described procedure. Upon removal of the wafer from the water baths with its surface covered by a layer of water, it was mounted onto a sample holder under running high-purity water, and spinning of the holder was initiated. The rotation speed of the holder was brought to several thousand rpms and upon reaching this speed, the flow of water was rapidly terminated to allow the substrate to dry. The spinning of the wafer was continued for approximately 2 minutes after the termination of the water flow. To ensure a well-controlled oxide layer thickness, the time from the initial immersion of the wafer into the water used in the last rinse procedure until termination of the water flow during spinning was controlled to be 2 minutes in duration. The molybdenum sample holder of the MBE apparatus was heated to a temperature of approximately 200 degrees C. A thin layer of indium (99.9999 percent pure) was spread on the sample holder utilizing a clean tungsten wire. The wafer was then placed on the molten indium layer, and the wafer was traversed relative to the sample holder so that the majority of the occluded air or trapped air was forced from between the wafer and the indium melt.

The deposition effusion sources of the MBE apparatus were fabricated solely from refractory metals and pyrolytic boron nitride. The effusion sources, 6, were outgassed by placing them in a vacuum chamber having a pressure of below $1 \times 10^{-8}$ Torr at 1600 degrees C. for approximately 1 hour. A pyrolytic boron nitride crucible was inserted into each effusion source and the combinations were again outgassed. Each crucible was filled with one material to be used in the deposition process. These materials included 99.9999 percent purity gallium, 99.9999 percent purity arsenic, 99.99999 percent purity aluminum, and silicon having an impurity content of less than 1 ppb. The loaded sources were mounted in the deposition chamber, 8, of the MBE apparatus. The pressure in the deposition chamber was reduced to approximately $10^{-11}$ Torr using conventional means. Additionally, a helium closed-loop cryopump, 14, a titanium gettering pump, and liquid nitrogen cold traps were also employed to ensure that species such as carbon monoxide and water vapor, which cause degradation of the deposited layer, are substantially reduced. The source material was then outgassed by heating the gallium, aluminum, and silicon sources to approximately 1400 degrees C. The arsenic source was heated to approximately 400 degrees C. to reduce the amount of trapped gases without substantially reducing the amount of arsenic present. After approximately 5 minutes of outgassing the source temperatures of the nonvolatile species, i.e., aluminum, gallium and silicon were reduced, respectively, to 800, 500, and 500 degrees C. while the temperature of the volatile species, i.e., arsenic, was reduced to below room temperature. (The temperatures employed for the nonvolatile species were maintained to keep these materials either in a molten or heated state.)

The substrate was inserted into the vented loading chamber, 20, in FIG. 1. The chamber was then sealed and evacuated to a pressure of approximately $10^{-7}$ Torr. The preparation chamber, 12, was evacuated to a pressure of approximately $10^{-9}$ Torr. The sample was then transferred through a gate valve from the loading chamber into the preparation chamber utilizing a pressure of approximately $3.7 \times 10^{-7}$ Torr was measured on an ionization gauge that was placed in the position that the substrate was to occupy upon deposition. This pressure reading corresponded to a flux of approximately $5 \times 10^{-14}$ cm$^{-2}$ sec$^{-1}$. The flux was measured by opening the shutter, 7, of the gallium source for a brief period (about 5 minutes) to obtain a steady-state pressure reading. Similarly, the arsenic source was heated to a temperature of approximately 350 degrees C. and adjusted to yield a pressure as read by the ionization gauge of approximately $1 \times 10^{-5}$ Torr which corresponded to a flux of approximately $1 \times 10^{15}$ cm$^{-2}$ sec$^{-1}$. The arsenic shutter remained opened for approximately 5 minutes, again to reach a steady-state condition. The ionization gauge was removed and the substrate was rotated into the growth position as shown in FIG. 1. The substrate was heated to a temperature of approximately 500 degrees C. An electron beam from a reflection electron diffractometer, 50, was directed to impact the substrate at a glancing angle. The arsenic shutter was then opened and the substrate subjected to an arsenic flux. The electron diffraction pattern was monitored and when the shutter was opened, the temperature of the substrate was increased to approximately 610 degrees C. at a rate of approximately 10 degrees C./minute. The arsenic flux was continued until sharp streaks, characteristic of an arsenic-stablized, reconstructed surface, were observed from the electron reflection pattern. This reconstruction took approximately 10 minutes. The shutter for the gallium source was then opened to initiate growth of gallium arsenide. At the time the gallium shutter was opened, the rotation of the substrate at a rate of approximately 4 rpms was initiated. The growth was continued until the desired thickness was obtained. The growth rate was approximately 0.85 micron per hour. At approximately the same time the desired thickness was attained, the shutters were closed, the substrate heating was terminated, the substrate was rotated to face away from the sources, and the 4 rpm rotation ended. The substrate was then removed from the apparatus by sequentially transferring it from the deposition chamber to the preparation chamber and then to the loading chamber. The resulting undoped GaAs layer had a resistivity of approximately $10^7$ ohm-cm, which is indicative of a high-purity material.

EXAMPLE 2

Figure 3:
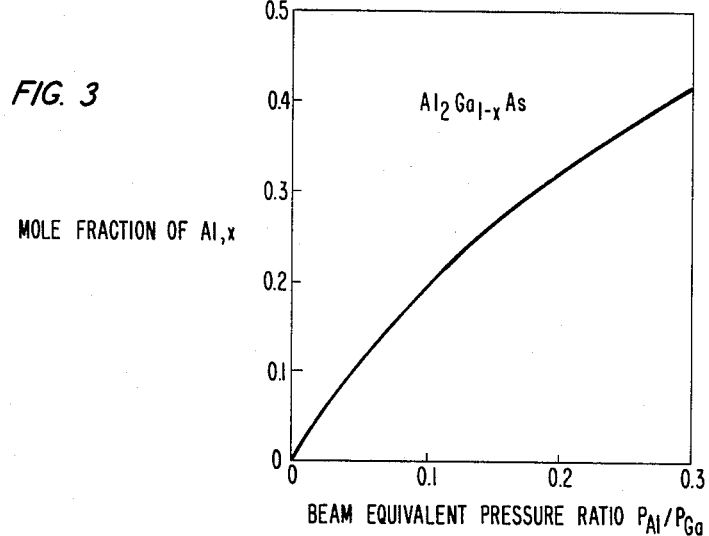

The procedure of Example 1 was followed except the silicon source was also utilized to produce doped gallium arsenide. In this procedure, the silicon temperature was raised from the idle temperature to a temperature in ture was then adjusted with the aluminum source shutter open to a pressure level yielding a desired flux. The shutter was then closed. During deposition when it was desired to form an aluminum gallium arsenide layer, the aluminum, together with the gallium and arsenide shutters, was opened and an aluminum gallium arsenide layer was formed. The mole fraction of aluminum and gallium in the resulting aluminum gallium material depended on the ratio of aluminum to gallium flux. This dependency is shown in FIG. 3.

To produce a doped aluminum gallium arsenide composition, the procedure of Example 2 was followed except the aluminum shutter was also opened. Doped $Al_{0.3}Ga_{0.7}As$ layers were produced with net carrier densities in the range $1 \times 10^{15}$ to $2 \times 10^{18}$ cm$^{-3}$.

EXAMPLE 4

A gallium arsenide field effect transistor was made utilizing the inventive process and materials. This device was formed by first depositing an undoped layer of gallium arsenide having a thickness of approximately 1 micron by the procedure of Example 1. After the 1 micron layer thickness was achieved, the silicon shutter was opened and a doped layer having a thickness of approximately 0.75 micron was deposited. The temperature of the silicon source was adjusted so that the dopant concentration in the doped layer was approximately $9 \times 10^{16}$/cm$^3$. After the desired thickness of 0.75 micron was achieved, the temperature of the silicon source was increased to yield a 0.35 μm thick GaAs layer having a doping level of approximately $1 \times 10^{-18}$/cm$^3$. In this matter, a layer useful for facilitating the production of a low-resistance source and drain contact to the active region (the region having a $9 \times 10^{16}$/cm$^{-3}$ dopant level) was fabricated. The structure, thus produced, was removed from the MBE apparatus, and the source, drain, and gate contacts along with appropriate electrical leads were added according to the process described in W. C. Niehaus et al, Institute of Physics Conference Series, 33b, 271 (1977) and W. C. Niehaus et al, "GaAs Power FETs Device Designed Principles and Fabrication Processes," GaAs FET Principles and Technologies, ed. J. V. DiLorenzo, Artech House, Boston (1982). Field effect transistors of various sizes were thus fabricated.

The gain achieved at various frequencies for both transistors having a total gate width of 3 mm and 6 mm is shown in the following table.

TABLE I

| Frequency (GHz) | Gain (dB) | |
| --- | --- | --- |
| | 3 mm | 6 mm |
| 8 | 12.6 | 12.3 |
| 10 | 11.5 | 10.5 |
| 12 | 9.8 | 9.1 |

Figure 4:
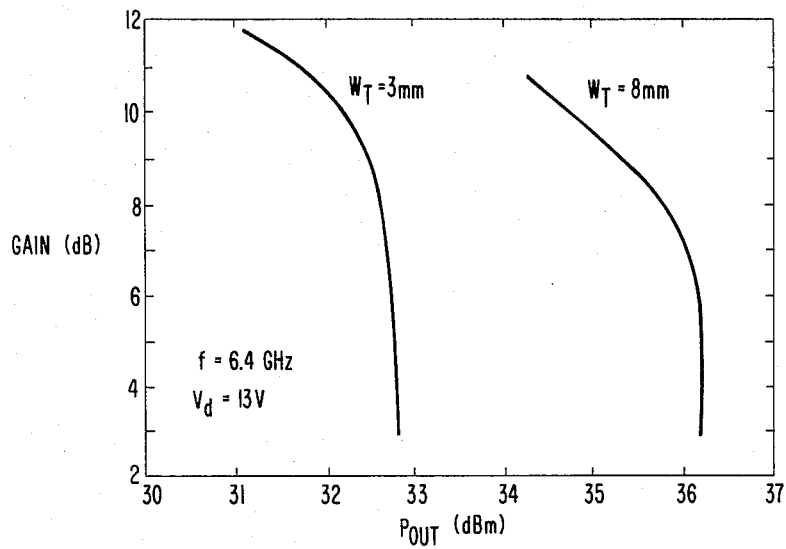
Figure 5:
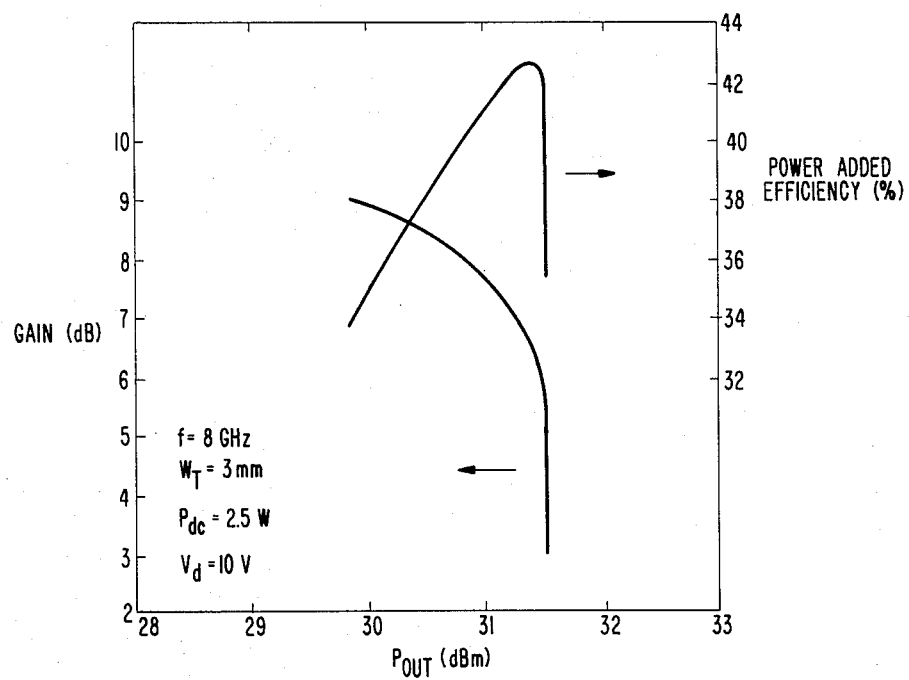

The gain in the table is for very small signals applied to the gate (power input of approximately 20 mW/mm) with a drain voltage of 14 V. A graph of gain versus power output is shown in FIG. 4 for devices having both 3 mm and 8 mm gate widths. The data for the graph was taken utilizing a drain voltage of 13 volts and a signal frequency of 6.4 GHz. At each output power level, the gate bias and tuning were adjusted to yield maximum gain. The gain measured at an output power 1 dB less than that of the saturated power was 10.9 and 9.2 dB for the 3 mm and 8 mm devices, respectively. This should be compared with a value of approximately 8.8 and 8.3 for 3 mm and 8 mm devices, respectively, prepared by CVD techniques. The gain versus power output characteristic of the gallium arsenide FETs was also measured utilizing a drain voltage of 10 V and a DC power input of 2.5 W for a device with a 3 mm gate width operated with a gate signal of 8 GHz. Gain versus output power and power efficiency versus output power results are shown in FIG. 5. The maximum efficiency of 43 percent compares favorably to efficiencies such as 36 percent obtained in similar devices produced by CVD.

EXAMPLE 5

A selectively doped heterostructure transistor (SDHT) was prepared utilizing the inventive process and materials. In particular, a 0.85 micron thick undoped layer of gallium arsenide was deposited as described in Example 1. The aluminum shutter was then opened and an aluminum flux initiated to produce, by the procedure of Example 3, a 60 Å thick layer of $Al_{0.3}Ga_{0.7}As$. A 460 Å thick layer of silicon-doped $Al_{0.3}Ga_{0.7}As$ was then deposited on the undoped aluminum gallium arsenide by opening the silicon shutter. The silicon temperature was initially adjusted to yield a dopant concentration of approximately $2 \times 10^{18}$ cm$^{-3}$ in this doped region. The aluminum shutter was closed upon achieving the doped aluminum gallium arsenide layer thickness, and a doped gallium arsenide layer having a thickness of approximately 500 Å and a dopant concentration of approximately $3 \times 10^{18}$ cm$^{-3}$ was deposited as described in Example 2. (The difference between the doping levels in the gallium arsenide and the aluminum gallium arsenide layers resulted from a difference in growth rates and doping efficiencies.) The processed body was then removed from the MBE apparatus. Electron mobilities as high as 501,000 cm$^2$/Vs were measured for these processed bodies.

Figure 6:
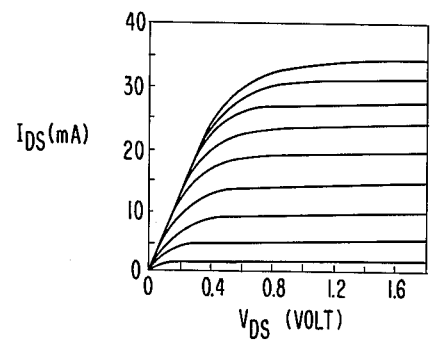

The source, drain, and gate contacts were produced as described in Example 4. The resulting device (SDHT) had a source-drain resistance of approximately 1.0 ohm-mm and a transconductance of approximately 200 mS/mm at 80 degrees K. The device also had a very high output conductance indicative of a high-quality buffer layer. The drain characteristics of the device are shown in FIG. 6.

What is claimed is:

1. A process for producing a device, said device based on a III–V based semiconductor material comprising the steps of depositing said III–V based semiconductor material on a substrate characterized in that
   (1) a passivating layer is formed on said substrate before said deposition,
   (2) said passivating layer is removed in the presence of a flux of a volatile group V entity that repairs the surface of said substrate, wherein sufficient repair is essentially completed before said deposition is initiated to yield a surface exhibiting a reflection electron diffraction pattern having essentially continuous streaks,
   (3) said repair of said substrate is accomplished at a repair temperature above the passivating layer removal temperature and below the incongruent melting temperature of said semiconductor material wherein said flux is adequate to produce a repair of said surface which is sufficient to yield a stripped electron diffraction pattern, and
   (4) performing said deposition by treating said substrate with a flow containing an entity corresponding to each atom composing said semiconductor material, wherein the total flux of the volatile entities in said flow is in excess to the total flux of the nonvolatile entities in said flow.

2. The process of claim 1 wherein said semiconductor material is GaAs.

3. The process of either claim 1 or claim 2 wherein said flow contains a dopant.

4. The process of claim 3 wherein said dopant comprises silicon.

5. The process of claim 1 wherein said semiconductor material comprises gallium aluminum arsenide.

6. The process of claim 1 wherein said substrate comprises gallium arsenide.

7. The process of claim 6 wherein said repair temperature is in the range 530 to 630 degrees C.

8. The process of claim 1 wherein said passivating layer is an oxide layer.

9. The process of claim 8 wherein said oxide undergoes said removal thermally.

10. The process of claim 8 wherein said oxide is formed by subjecting said substrate to water.

* * * * *